United States Patent [19]

Yonezawa et al.

[11] Patent Number: 5,708,222

[45] Date of Patent: Jan. 13, 1998

[54] INSPECTION APPARATUS, TRANSPORTATION APPARATUS, AND TEMPERATURE CONTROL APPARATUS

[75] Inventors: Toshihiro Yonezawa, Kitakoma-Gun; Tsuyoshi Argua, Kofu; Kunihiro Furuya, Nirasaki; Junichi Hagihara, Kofu, all of Japan

[73] Assignees: Tokyo Electron Limited; Tokyo Electron Yamanashi Limited, both of Japan

[21] Appl. No.: 509,284

[22] Filed: Jul. 31, 1995

[30] Foreign Application Priority Data

| Aug. 1, 1994 | [JP] | Japan | 6-200138 |
| Aug. 1, 1994 | [JP] | Japan | 6-200139 |
| Aug. 10, 1994 | [JP] | Japan | 6-210627 |

[51] Int. Cl.$^6$ .............................. G01M 19/00; H02P 1/42
[52] U.S. Cl. ..................... 73/865.8; 324/754; 324/537; 414/941
[58] Field of Search ............... 73/865.8; 324/754, 324/756, 757, 537; 198/345.1, 346.2; 414/935, 941, 225

[56] References Cited

U.S. PATENT DOCUMENTS

| 4,924,715 | 5/1990 | Schaffer | 73/865.8 |
| 5,151,651 | 9/1992 | Shibata | 324/754 |
| 5,220,279 | 6/1993 | Nagasawa | 324/754 |
| 5,384,531 | 1/1995 | Yamazaki et al. | 324/754 |
| 5,434,513 | 7/1995 | Fujii et al. | 324/754 |

Primary Examiner—Richard Chilcot
Assistant Examiner—Max H. Noori
Attorney, Agent, or Firm—Beveridge, DeGrandi, Weilacher & Young, L.L.P.

[57] ABSTRACT

There is provided an inspection apparatus comprises, a transportation unit for transporting the object of inspection to a position opposite to the contact portion, a sucking holder movable toward and away from the contact portion and adapted to hold the object of inspection by suction; and a pressure contact mechanism provided separately from the transportation unit and adapted to press the sucking holder, thereby pressing the object of inspection against the contact portion. Thus the tranportation mechanism is separated from the pressure contact mechanism, the transportation mechanism can be reduced in weight, and the pressure contact mechanism can ensure setting of appropriate pressing. The operation time can be shortened, moreover, since the object of inspection is kept attached to the contact portion by the transportation mechanism as it is pressed against the contact portion. There is provided a transportation apparatus in which objects of transportation or inspection can be stably attracted or released without the possibility of their being broken by static electricity and without being influenced by their attitude. There is provided a temperature control apparatus used in an inspection apparatus and capable of efficiently heating or cooling an object of inspection, further, wherein a carrier plate section can be used in common for objects of inspection of different descriptions.

4 Claims, 11 Drawing Sheets

INSPECTION APPARATUS, TRANSPORTATION APPARATUS, AND TEMPERATURE CONTROL APPARATUS

BACKGROUND OF THE INVENTION

1. Field of the Invention

The present invention relates to an inspection apparatus for inspecting, for example, packaged devices, a transportation apparatus for transporting, for example, packaged devices to be inspected, and a temperature control apparatus for preheating, for example, packaged devices.

2. Information of the Related Art

Packaged devices are checked for electrical properties. According to conventional inspection apparatuses for this purpose, electrical contact between reed terminals of the devices and a test head is obtained by using a socket unit in the case where the pitch of the reed terminals is relatively long or by means of probes of a probe card in the case where the terminal pitch is relatively short.

In a socket-type inspection apparatus, devices are transported from supply-side trays to a preheating unit to be preheated thereby, transferred temporarily to an aligning unit for supply, and then delivered to the socket unit to be checked for specific electrical properties therein. Thereafter, the devices are transferred to an aligning unit for storage, and then distributed to delivery-side trays in accordance with the results of the inspection.

In order to conduct a test for checking devices accurately for electrical properties, the reed terminals of the devices must be pressed against electrodes of the socket unit for reliable contact. Conventionally, this is attained by the following two methods.

(1) A transportation mechanism for devices is provided with a pressure contact mechanism which utilizes air pressure. After each device is transported to the socket unit in a manner such that it is attracted and held by the transportation mechanism, the device is pressed against the socket unit by the pressure contact mechanism without being released from the hold.

(2) The pressure contact mechanism is provided independently of the transportation mechanism. The transportation mechanism transports each device to the socket unit, and is moved away from the socket unit. Thereafter, the device is pressed directly against the socket unit by the pressure contact mechanism.

According to the method (1), however, the transportation mechanism is furnished with the pressure contact mechanism, so that it is heavy in weight, and requires use of a large-capacity motor in order to achieve high-speed transportation. Since the pressure contact mechanism should be light in weight, moreover, it is expected actually to be one which utilizes air pressure. However, air pressure may not be able to secure accurate pressure contact or may develop into an over pressure which may possibly damage the reed terminals. If the number or thickness of the reed terminals of the device changes, an optimum pressure to be applied to the device, in order to bring the reed terminals securely and smoothly into contact with the electrodes of the socket unit, varies. It is difficult, however, to set the optimum contact pressure with use of air pressure.

According to the method (2), each device is pressed after the transportation mechanism is moved away from the device. When the test is finished, moreover, the device is attracted and held by the transportation mechanism after the pressure contact mechanism is moved away from the device.

Thus, the time before the start of the inspection and the time before the start of the transportation of the inspected device from the socket unit are so long that a high throughput cannot be obtained.

A transportation apparatus is used to attract and transport devices from the aligning unit for supply to the socket unit. The transportation apparatus is constructed so that a movement mechanism movable in X-, Y- and Z-directions is located on the inspection apparatus, and a sucking holder is mounted on the underside of the movement mechanism. The sucking holder is provided on its lower surface with a rubber sucker pad or metallic bellows having a suction hole, and is designed so that its lower surface comes intimately into contact with the upper surface of each device, thus holding the device by suction through the suction hole. A test is conducted on the device which is held by suction and mounted in the socket unit.

In the conventional transportation apparatus, however, the package for each device is a resin molding in the case where the rubber sucker pad is used for the sucking holder. In some cases, therefore, static electricity may be generated by contact between the sucker pad and the package, possibly causing static breakdown of the device. Moreover, the sucker pad is so flexible that the device is bound to ruin its attitude considerably when it is landed in the aligning unit for storage, and the device is released in this state. Accordingly, the attitude of the device gets out of the allowable range for alignment, thereby constituting a hindrance to transportation in the next stage.

In the case where the metallic bellows is used for the sucking holder, on the other hand, the surface of attraction lacks in flexibility, so that some devices may fail to be attracted when they are skewed. After repeated use, moreover, the strength of stability of each device is so low that the surface of attraction ceases to be intimately in contact with the upper surface of the device if the device is inclined at the narrowest angle. Thus, there is a substantial possibility of the device failing to be attracted. Further, the devices are heated by means of a heating portion which is attached to the metallic bellows, so that the outside diameter of the bellows must be increased to cope with an increase in the device size.

The devices are heated when they are subjected to the aforesaid inspection, and a device preheating apparatus is used to attain this. In transporting the devices in the inspection apparatus, each four devices, for example, are transported from a supply-side tray to a first aligning unit for supply by means of a loader in a manner such that they are held by suction from above, and are then aligned in conformity to the configuration of recesses in the aligning unit. Subsequently, the devices are transported from the first aligning unit to the preheating apparatus and then to a second aligning unit for supply by the loader. In socket-type inspection, for example, the devices are transported thereafter to the socket unit by means of a transportation mechanism which has a suctional holding function, whereupon they are checked for electrical properties.

Figure 13:
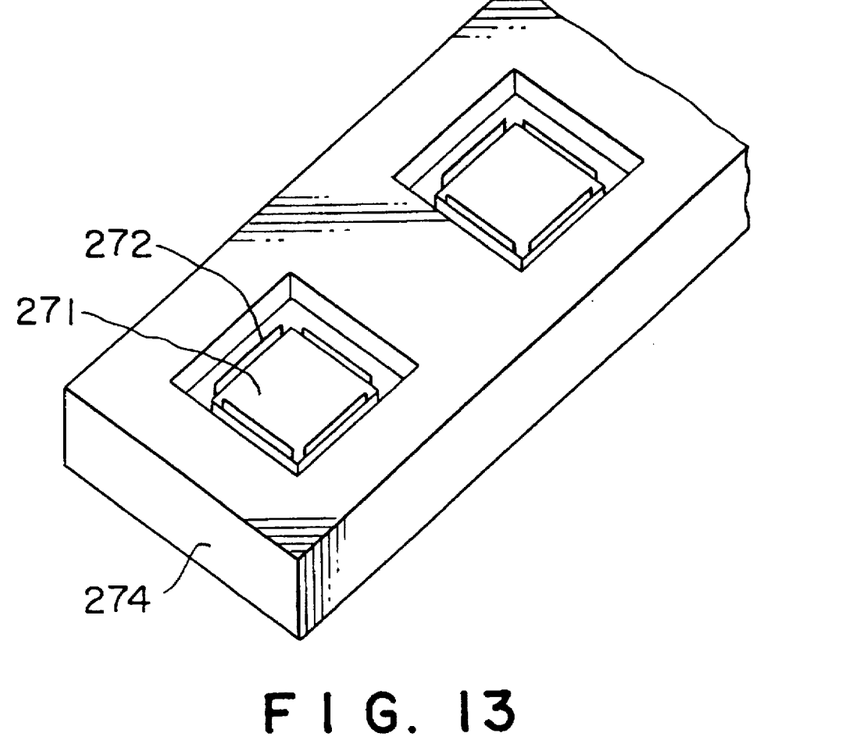
FIG. 13 is a perspective view showing the principal part of a prior art preheating apparatus used in an inspection apparatus.
Figure 14:
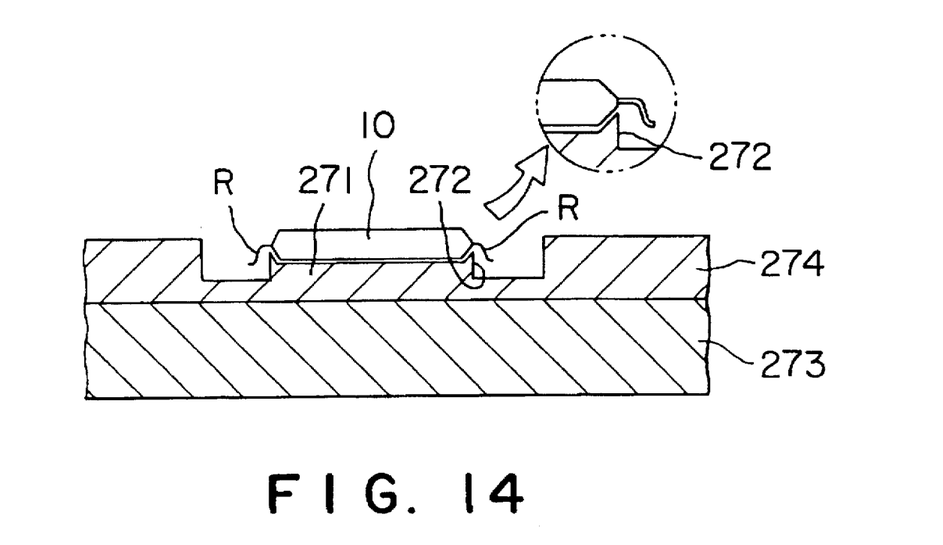
FIG. 14 is a sectional view showing the principal part of the preheating apparatus shown in FIG. 13.

The preheating apparatus is constructed so as to be able to heat a large number of arranged devices simultaneously. Referring to FIGS. 13 and 14, an arrangement of a unit region for heating each individual device will be described. In these drawings, numeral 271 denotes carrier portions. Positioning ribs 272 are formed individually on the peripheral edges of each carrier portion 271, and the surface surrounding the carrier portion 271 is recessed so that reed terminals R can extend each device 10. If the ribs 272 are dislocated or skewed when the device 10 is released from suction by the loader, for example, the reed terminals R of the device 10 is inevitably bent when the device 10 is attracted next time. To avoid this, the ribs 272 are arranged so as to be free from dislocation. The size of a bearing region (region surrounded by the ribs 272) of the carrier plate section 271 varies depending on the shape of the device 10. In order to cope with the diversity of various devices 10, therefore, the preheating apparatus is designed so that a device carrier plate section 274 with the carrier portions 271 is put on a common heating unit 273 in a replaceable manner.

The devices are delicately different in size depending on the user applications even though they are of the same grade. Actually, therefore, devices of the same grade may be different in description. On the other hand, each bearing region of the preheating apparatus surrounded by the ribs 272 should have a size which corresponds accurately to the device size, so that a plurality of carrier plate sections 274 must be provided for devices of each grade. Accordingly, the carrier plate section 274 requires replacement every time the device grade is changed, thus entailing higher cost.

Since the devices are placed on the carrier portions 271 of the carrier plate section 274 by gravity only, moreover, the intimateness of contact between each device and the bearing surface is so poor that heat from the heating unit 273 cannot be efficiently transferred to the devices, in some cases. In order to set each device securely in the bearing region surrounded by the ribs 272, furthermore, the device must be temporarily placed on an aligning block to be aligned thereon before it is transported to the preheating apparatus. To attain this, an aligning unit and a longer processing time are inevitably essential.

SUMMARY OF THE INVENTION

The first object of the present invention is to provide an inspection apparatus which ensures a high throughput in checking an object of inspection for electrical properties by pressing it against a contact portion, and facilitates setting of appropriate pressing.

The second object of the present invention is to provide a transportation apparatus in which objects of transportation or inspection can be stably attracted or released without the possibility of their being broken by static electricity and without being influenced by their attitude.

The third object of the present invention is to provide a temperature control apparatus used in an inspection apparatus and capable of efficiently heating or cooling an object of inspection, further, wherein a carrier plate section can be used in common for objects of inspection of different descriptions.

In order to achieve the first object, according to the present invention, there is provided an inspection apparatus for inspecting an object of inspection, having a terminal portion, for electrical properties in a manner such that the object is pressed against a contact portion to bring the terminal portion and the contact portion into contact with each other, comprising:

a transportation unit for transporting the object of inspection to a position opposite to the contact portion;

a sucking holder movable toward and away from the contact portion and adapted to hold the object of inspection by suction; and a pressure contact mechanism provided separately from the transportation unit and adapted to press the sucking holder, thereby pressing the object of inspection against the contact portion.

The sucking holder holds the object of inspection by suction and transports it to the contact portion so that the terminal portion of the object is in contact with electrodes of the contact portion. When the pressure contact mechanism then presses the sucking holder toward the contact portion, the terminal portion of the object of inspection is pressed against the electrodes of the contact portion, thereby securing a reliable electrical contact. After inspection, the object of inspection is released from the press by the pressure contact mechanism, and is transported to a predetermined position by the transportation mechanism. Thus the transportation mechanism is separated from the pressure contact mechanism so that the transportation mechanism can be reduced in weight. The operation time can be shortened, moreover, since the object of inspection is kept attached to the contact portion by the transportation mechanism as it is pressed against the contact portion. Also, a mechanism having a high accuracy of positioning, for example, a pulse motor, can be used as the pressure contact mechanism, so that the setting of appropriate pressing can be ensured.

In order to achieve the second object, according to the present invention, there is provided a transportation apparatus for transporting an object of transportation in a manner such that the object is held by suction, comprising:

a sucking holder body the lower surface of which constitutes a guide face for guiding the upper surface of the object of transportation;

a metallic sucker pad having a lower limit position confined to the inside of the sucking holder body, projecting a little downward from the guide face when in the lower limit position, adapted to be fitted in so as to be able to move up and down and incline at an angle to the axis of the sucking holder body, and having a sucking function; and electrically conductive elastic means located in a gap between the sucking holder body and the sucker pad.

In the case where the object of transportation is inclined at an angle to the surface of attraction of the sucker pad when the pad is in contact with the upper surface of the object, according to the present invention, the sucker pad is inclined along the upper surface of the object, resisting the elastic force of the elastic means, thereby coming intimately into contact with the upper surface of the object. Moreover, the sucker pad holds the object of inspection by suction and transports it to the position for inspection, e.g., a socket unit, and the sucking holder body presses the object toward the position for inspection. Thus, an electrical measurement can be conducted with the reed terminals of the object of inspection, for example, securely in contact with the electrodes.

With use of the sucker pad arranged in this manner, the object of transportation or inspection can be securely attracted without regard to its attitude, and cannot be broken by static electricity. Moreover, the sucker pad is so hard that the object can be released from the attraction without changing its attitude. If the first and second sections are arranged so as to be slightly movable with respect to each other, the positioning accuracy of a movement mechanism can be eased. Furthermore, the object of inspection can be steadily heated through the guide face without regard to its external shape.

In order to achieve the third object, according to the present invention, there is provided a temperature control apparatus which heats or cools an object of inspection having a terminal portion and is used in an inspection apparatus for inspecting the heated or cooled object for electrical properties in a position for inspection, comprising:

a carrier plate section having a recess in the surface portion thereof to receive the object, and a carrier portion formed in the recess and serving to carry the object of inspection thereon;

a temperature control unit for heating or cooling the carrier plate section; and suction means for sucking the object of inspection to attract it to the carrier portion.

Preferably, the suction means may include a suction hole opened in the carrier portion.

According to the temperature control apparatus of the present invention, the objects of inspection are transported onto the carrier portions in the recesses of the carrier plate section in a manner such that their respective upper surfaces are held by, for example, vacuum suction by means of the transportation mechanism, whereupon they are preheated (or precooled). Thereafter, the objects are delivered to the position for inspection via, e.g., an aligning unit by the transportation mechanism, and are checked for electrical properties in a heated (or cooled) state. Since the objects of inspection are attracted to the carrier portions by vacuum suction, the intimateness of contact between them is high enough to heat the objects efficiently. If the depth of each recess is adjusted so that the object of inspection does not project from the surface of the carrier plate section, as mentioned before, the influence of the outside air can be reduced, and the objects can be adjusted to a constant temperature at all times. Since the objects of inspection are attracted to the carrier portions by vacuum suction, moreover, they cannot move even when they are subjected to an impact caused by the release from the transportation mechanism. Thus, there is no need of positioning ribs, so that the carrier portions can be used in common for objects of inspection of different grades.

BRIEF DESCRIPTION OF THE DRAWINGS

FIGS. 9A and 9B are respectively diagrams for illustrating positions of a pin, in which FIG. 9B shows a position such that the first section is rockable.

DETAILED DESCRIPTION OF THE PREFERRED EMBODIMENTS

Preferred embodiments of the present invention will become understood from the following detailed description referring to the accompanying drawings.

Figure 1:
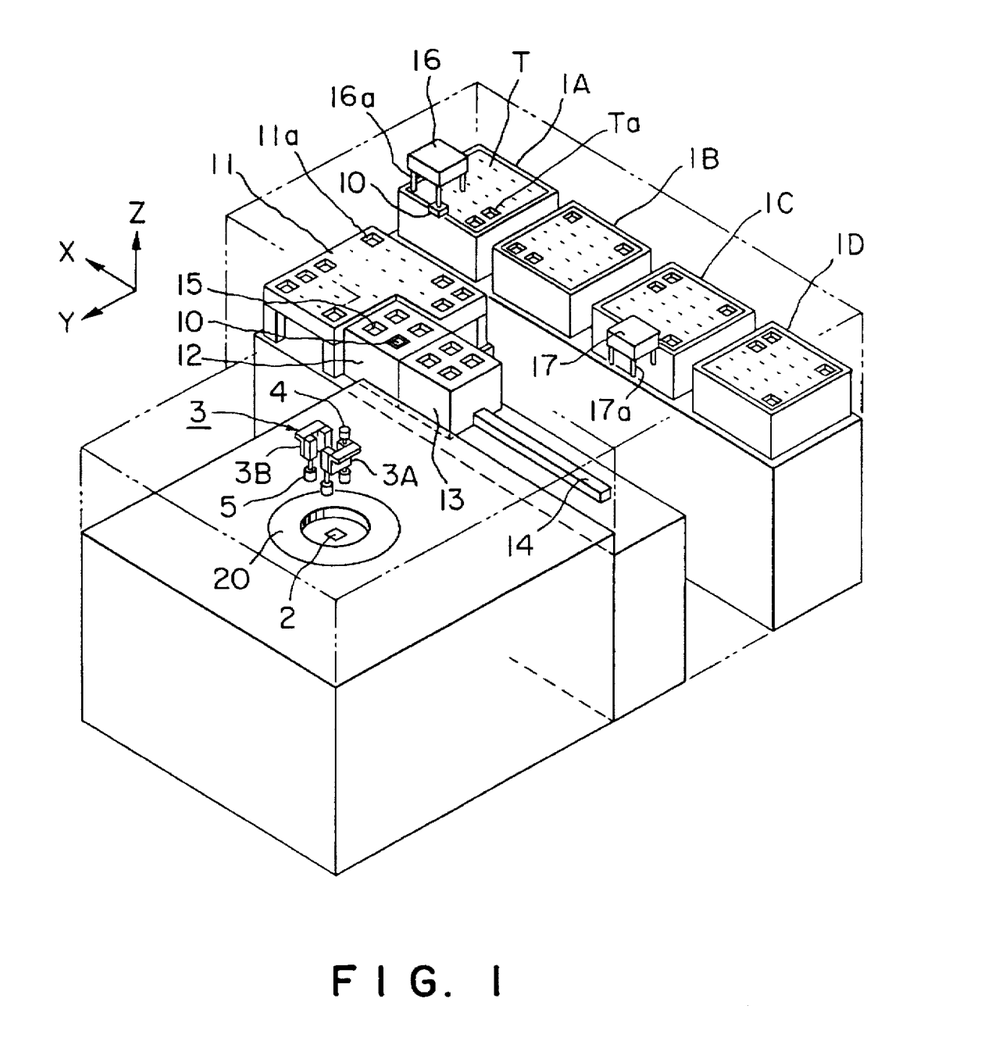
FIG. 1 is a general perspective view showing an outline of an inspection apparatus according to the first embodiment of the present invention.

The following is a description of a case in which a first embodiment of the present invention is applied to an inspection apparatus for devices formed of packaged semiconductor integrated circuit chips. This embodiment is characterized by a transportation mechanism for transporting the devices to a socket unit and a pressure contact mechanism for pressing the transportation mechanism. Referring first to FIG. 1, an outline of the inspection apparatus will be described in brief.

On the front side of the apparatus (rear side in FIG. 1), four tray carriers 1A, 1B, 1C and 1D are arranged in the X-direction. Actually, a plurality of trays are placed on each of the tray carriers 1A to 1D.

A preheating plate 11 is located opposite to the rear parts of the tray carriers 1A and 1B. Beside the preheating plate 11, aligning units 12 and 13 for supply and storage are arranged so that they are guided integrally by an X-rail 14 as they are moved by means of a drive mechanism (not shown). Each tray T and the preheating plate 11 are formed with recesses Ta and 11a, respectively, for individually storing devices 10, while the aligning units 12 and 13 are provided with recesses 15 each. When the devices 10 are put individually into the recesses 15 they are automatically horizontally aligned in a predetermined direction.

Each four devices 10 in each of the trays T on the tray carriers 1A and 1B are transferred at a time to the preheating plate 11 by means of a loader 16 which is provided with four sucking holders 16a, whereupon they are preheated. Then, the devices 10 are transported to the aligning unit 12 for supply. A socket unit 2 is arranged in a position for inspection which is situated at a Y-direction distance from a movement region for the aligning units 12 and 13 on the side farther from the tray carriers 1A to 1D. The socket unit 2, which has electrodes 22 around its device carrier 21, is held by means of a ring-shaped retainer 20 (see FIGS. 2 and 3). The socket unit 2 is touched by reed terminals R of each device 10, and serves to connect the reed terminals R electrically to a test head (not shown) thereunder. Also, the inspection apparatus is provided with a transportation mechanism 3 which holds the devices 10 from above and transports them between the socket unit 2 and the aligning units 12 and 13.

Further, a pressure contact mechanism 4 is fixed to the apparatus body, overlying the socket unit 2 and a movement region for a sucking holder (mentioned later) of the transportation mechanism 3. The pressure contact mechanism 4 causes the sucking holder to press each device 10 against the socket unit 2. After the inspection, the devices 10 are transported to the aligning unit 13 for storage, and are then distributed to the trays T on the tray carriers 1C and 1D in accordance with the results of inspection by means of an unloader 17 which, like the loader 16, is provided with four sucking holders 17a.

Figure 2:
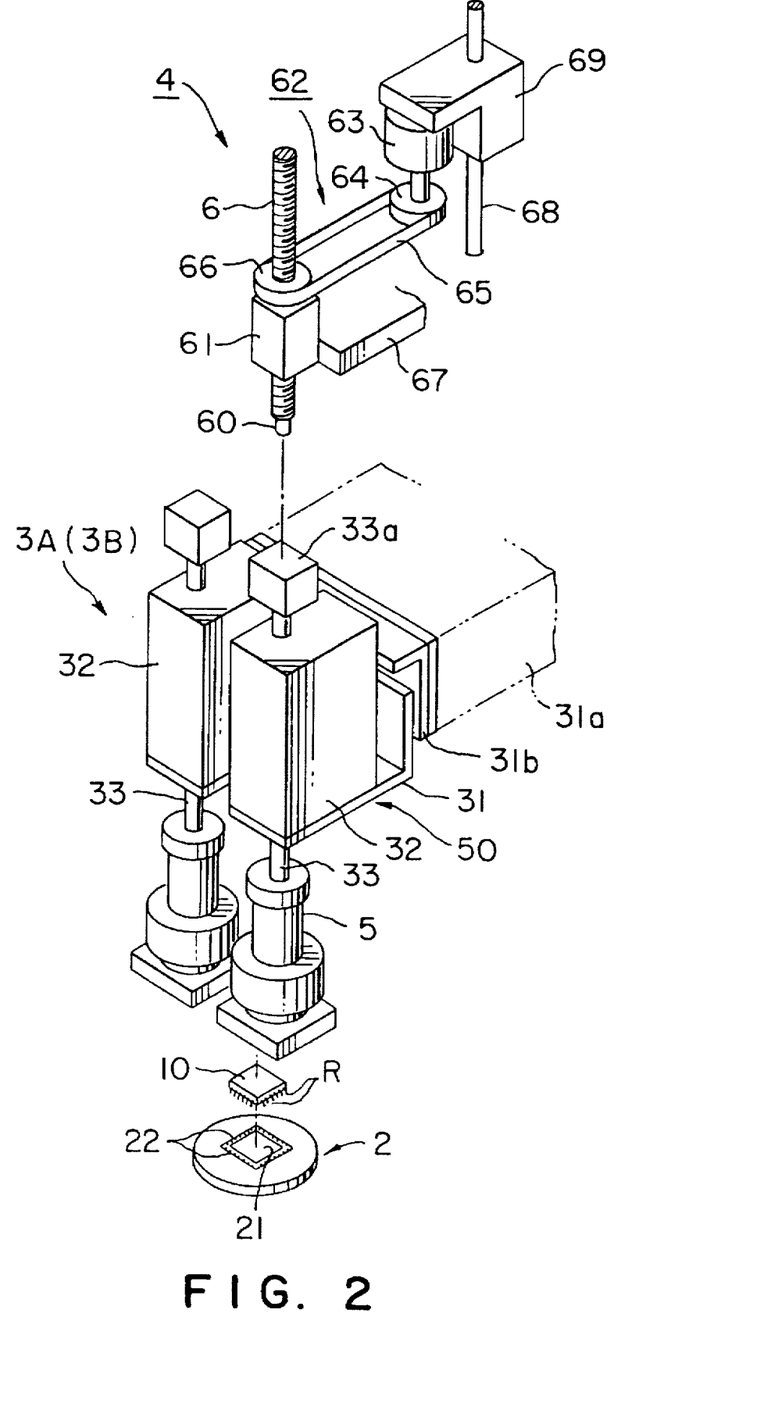
FIG. 2 is a schematic perspective view showing a transportation mechanism and a pressure contact mechanism used in the inspection of FIG. 1.
Figure 3:
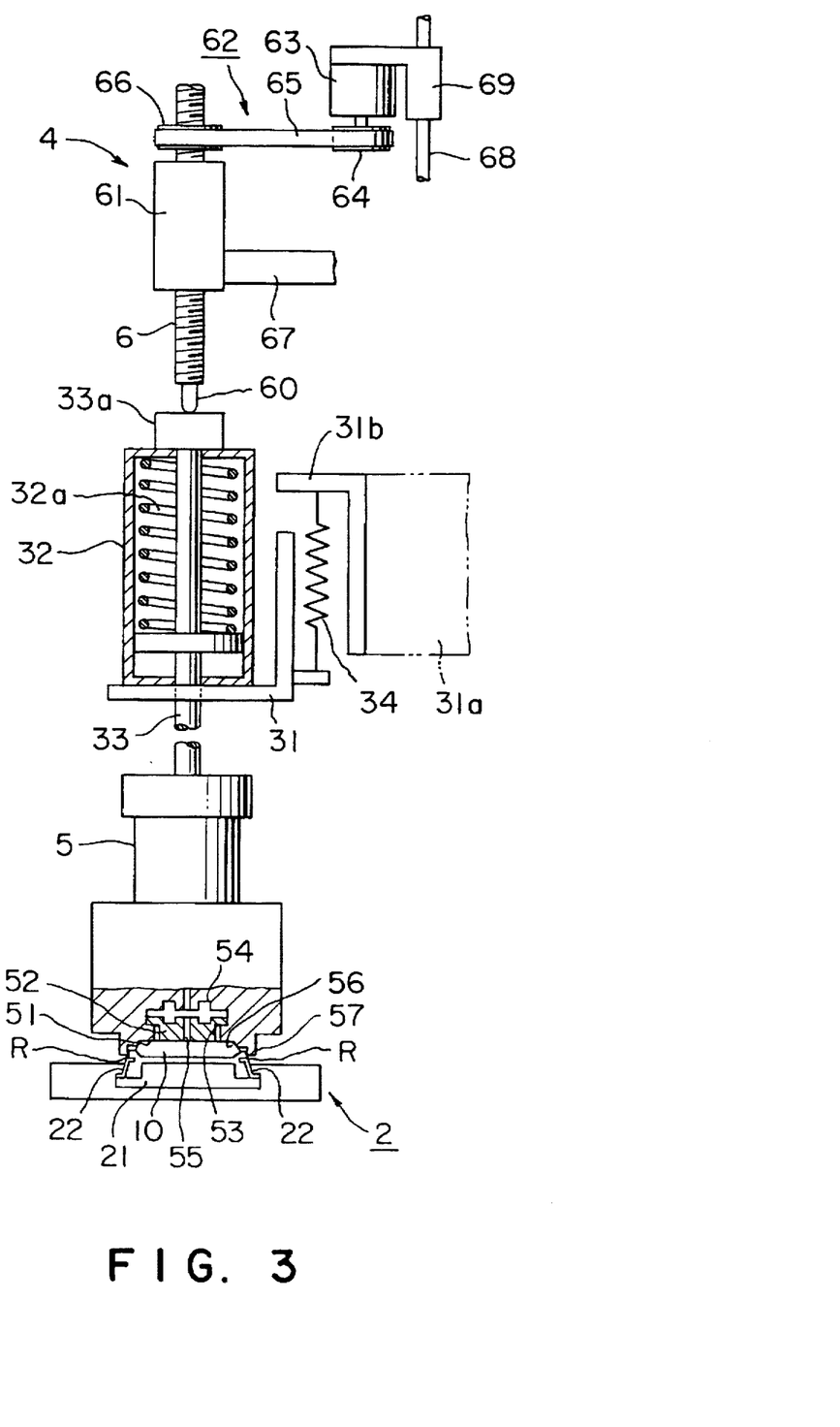
FIG. 3 is a cutaway side view showing the transportation mechanism and the pressure contact mechanism shown in FIG. 2.

Referring now to FIGS. 2 and 3, the transportation mechanism 3 and the pressure contact mechanism 4 will be described.

The transportation mechanism 3 comprises transportation units 3A and 3B which can be moved independently by means of an X-Y movement mechanism (not shown). The transportation units 3A and 3B can simultaneously hold the devices 10 by suction and move them up and down. The transportation unit 3A (3B) includes an L-shaped mounting plate 31b, which is attached to a portion 31a of the X-Y movement mechanism, and two cylinder fixing portions 31. Interposed between the mounting plate 31b and the cylinder fixing portions 31 are tension springs 34 which extend and contract vertically. Thus, the cylinder fixing portions 31 are suspended by means of the tension springs 34. An air cylinder 32 is fixed to each fixing portion 31, and is penetrated by a piston 33 which is moved up and down by air pressure from an air supply unit (not shown). In the air cylinder 32 is interposed a buffer spring 32a for urging the piston 33 downward.

A sucking holder body 5 for holding each device 10 is attached to the lower part of each piston 33. The lower surface of the sucking holder body 5 is formed as a guide face 51 for guiding the upper surface of the device 10, and a metallic sucker pad 52 slightly projects from the central portion of the guide face 51. In this embodiment, the piston 33 and the holder body 5 constitute a sucking holder 50. The sucker pad 52 is fitted in a recess 53 in the lower surface of the holder body 5 so that its lower limit position is confined to the inside of the recess 53, and that it can slightly move up and down and incline at an angle to the axis of the sucking holder 50. A compression spring 54 is interposed between the sucker pad 52 and the holder body 5.

A suction hole 55 for attracting the device 10 by vacuum suction is formed in the central portion of the sucker pad 52, whereby the pad 52 is sucked in upward at the time of vacuum attraction. A step portion 56 for guiding the upper edge portion of the device 10 is formed on the peripheral edge of the guide face 51. The step portion 56 is surrounded by a ridge portion 57 which guides the reed terminals R of the device 10 or abuts against the distal ends of the terminals R lest the terminals be dislocated.

On the other hand, the pressure contact mechanism 4 is provided separately from the transportation mechanism 3. The mechanism 4 comprises a vertical screw shaft 6 and a drive unit 62 for moving the shaft 6. The screw shaft 6 has a pusher 60 on its distal end, and is screwed in a screw receiving portion 61 with the aid of balls. In this example, the drive unit 62 includes a pulse motor 63, drive pulley 64, transmission belt 65, and pulley portion 66 formed on the screw shaft 6. The screw shaft 6 and the screw receiving portion 61 are constructed by a feed screw apparatus having a ball screw mechanism and a ball spline mechanism. The pulley portion 66 is rotated while the screw receiving portion and spline bearing portion 61 are maintained non-rotatably, so that the screw shaft 6 being maintained non-rotatably is moved longitudinally. A servomotor may be used in place of the pulse motor 63. The screw receiving portion 61 is fixed to a frame, which constitutes, e.g., a sheathing of the inspection apparatus, by means of a fixing member 67, while the pulse motor 63 is fixed to a motor mounting portion 68 which is fixed to a mounting member 67. In this case, the lift of the screw shaft 6 or the drive amount of the pulse motor 63 is previously set in accordance with the height of the device 10 (i.e., distance from the upper surface of the device 10 to the lower ends of the reed terminals R).

The following is a description of the operations of the transportation mechanism 3 and the pressure contact mechanism 4.

Figure 4A:
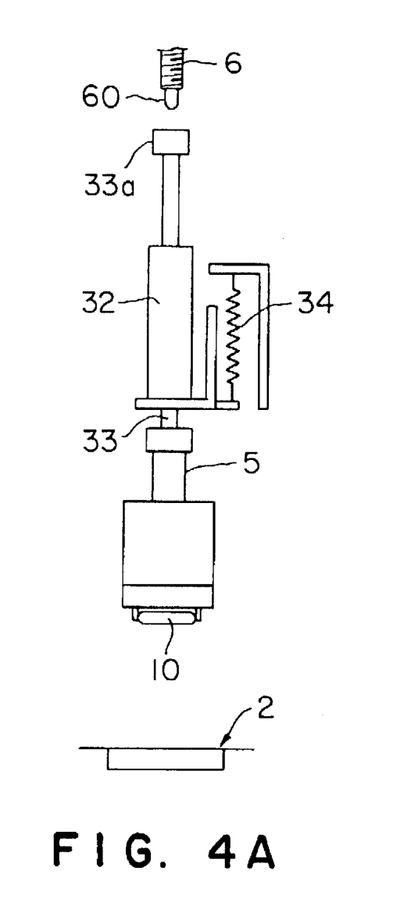
FIGS. 4A, 4B and 4C are respectively diagrams for illustrating the operations of the transportation mechanism and the pressure contact mechanism, according to the first embodiment.
Figure 4B:
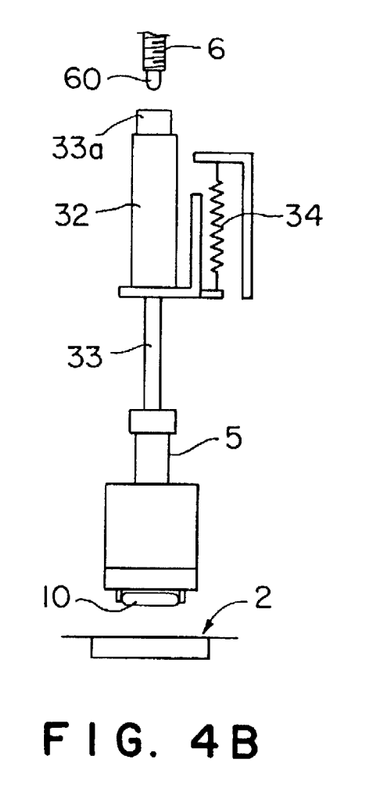

First, each two devices 10 as objects of inspection aligned by the aligning unit 12 are held by suction as they are transported to the contact portion, e.g., the socket unit 2, by the transportation unit 3A (3B) of the transportation mechanism 3. More specifically, each piston 33 is lowered by the air pressure in the air cylinder 32 so that the sucker pad 52 at the bottom of the sucking holder body 5 comes intimately into contact with the upper surface of the device 10 to attracts the device by vacuum suction. After the piston 33 is raised by the air pressure in the air cylinder 32, the sucking holder 50 is moved to the position over the socket unit 2 (state of FIG. 4A) by the X-Y movement mechanism, and is then lowered by the air pressure (state of FIG. 4B).

Figure 4C:
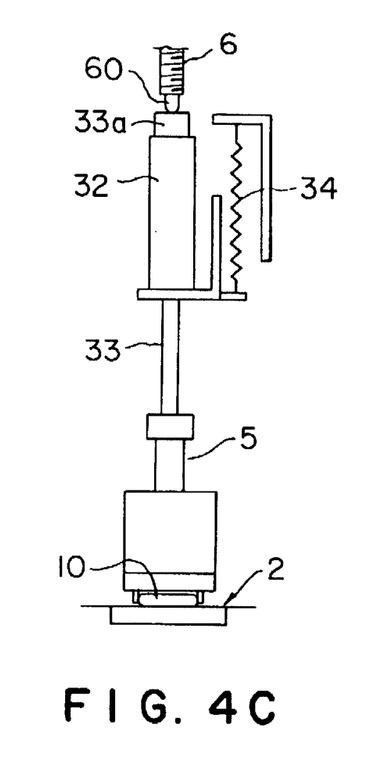

Thereafter, the pulse motor 63 is driven to lower the screw shaft 6, as shown in FIG. 4C, thereby pressing an end portion 33a of the piston 33. Thereupon, the piston 33, along with the air cylinder 32, is pressed down against the restoring force of the tension spring 34, so that the sucking holder body 5 descends so that the device 10 is placed on the carrier 21 of the socket unit 2. At the same time, the reed terminals R of the device 10 are guided by the ridge portion 57 of the sucking holder 5 lest they be dislocated as they come into contact with the electrodes 22.

Thereafter, the electrical properties of the device 10 are measured by means of the test head (not shown). When the measurement is finished, the screw shaft 6 ascends to keep away from the piston 33. At this time, the piston 33 is raised by the restoring force of the tension spring 34, so that the device 10 is lifted above the socket unit 2 in a manner such that it is attracted and held by the sucking holder 50, and then the piston 33 is raised by air pressure in the air cylinder 32. Then, the sucking holder 50 is moved to the position over the aligning unit 13 for storage by the X-Y movement mechanism, and the device 10 is transported to the aligning unit 13. Also, that device 10 which is held by the other sucking holder 50 of the transportation unit 3A (3B) is transported and measured for electrical properties in like manner.

According to the first embodiment described above, the movement of the screw shaft 6 is controlled by means of the pulse motor 63, and the piston 33 or the sucking holder 50 is pressed by the shaft 6, whereby the device 10 is pressed against the socket unit 2. Thus, the contact pressure can be adjusted finely. An optimum contact pressure for the device 10 on the socket unit 2 varies depending on the change in the number or thickness of the reed terminals of the device. Since the contact pressure can be adjusted finely, however, the electrical contact between the reed terminals R and the electrodes 22 can be secured under the optimum contact pressure, that is, without damaging the reed terminals. Thus, accurate electrical properties can be measured.

Further, the device 10 can be pressed against the socket unit 2 in a manner such that it is held by the transportation mechanism 3 without undergoing the process for transporting the device 10 to the socket unit 2 by means of the transportation mechanism 3, process for putting the transportation mechanism 3 out of the way, process for pressing the device 10 by means of the pressure contact mechanism 4, process for putting the pressure contact mechanism 4 out of the way, or process for holding the device 10 by means of the transportation mechanism 3. After the measurement, it is necessary only that the sucking holder 50 be moved after the screw shaft 6 of the pressure contact mechanism 4 is raised, so that a high throughput can be obtained. Since the pressure contact mechanism 4 is separated from the transportation mechanism 3, moreover, the transportation mechanism 3 can be reduced in weight, and can perform high-speed transportation without entailing an increase in the motor capacity.

In the pressure contact mechanism, the screw receiving portion may be lowered by rotating the screw shaft so that the sucking holder is pressed thereby. Moreover, the ball screw mechanism may be replaced with any of various other mechanical or pneumatic mechanisms. The object of inspection is not limited to the structure which has the reed terminals extending sideways therefrom, and may be a structure such that a terminal portion is exposed from the lower surface of the object body.

According to the first embodiment, as described above, the object of inspection can be pressed against the contact portion by means of the pressure contact mechanism in a manner such that it is held by the transportation mechanism, so that a high throughput can be obtained. Since the pressure contact mechanism is provided independently of the transportation mechanism, moreover, the transportation mechanism can be reduced in weight.

Since the ball screw mechanism is used as the pressure contact mechanism, furthermore, the pressure of contact between the device and the contact portion can be adjusted finely, that is, an optimum contact pressure can be enjoyed.

With reference to FIG. 5 to 9, the following is a description of a case in which a transportation apparatus according to a second embodiment of the present invention is applied to an inspection apparatus for devices formed of packaged semiconductor integrated circuit chips. The outline of the inspection apparatus is constructed as same as that of FIG. 1.

Figure 5:
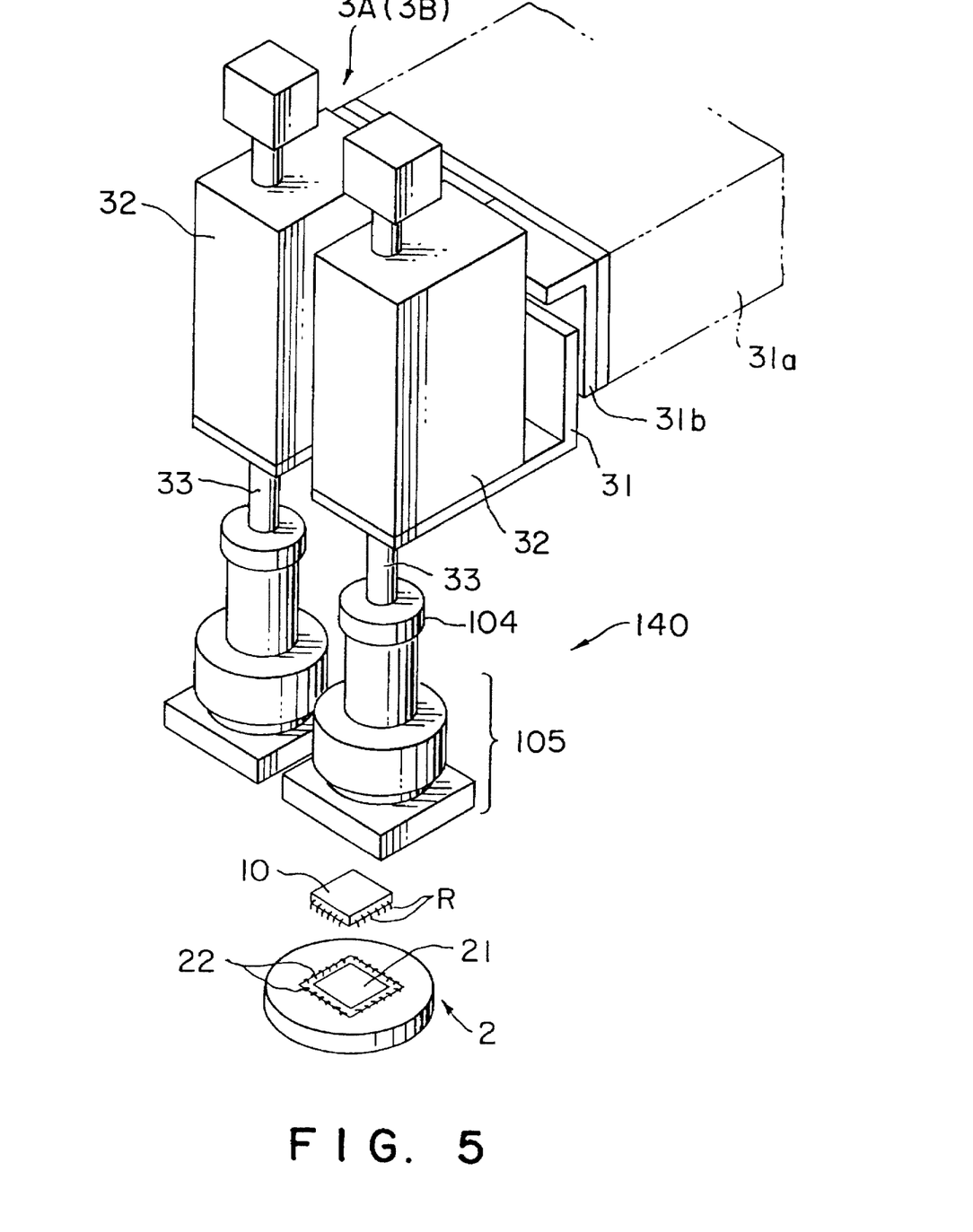
FIG. 5 is a perspective view showing an outline of a transportation unit of a transportation apparatus according to the second embodiment of the invention.
Figure 6:
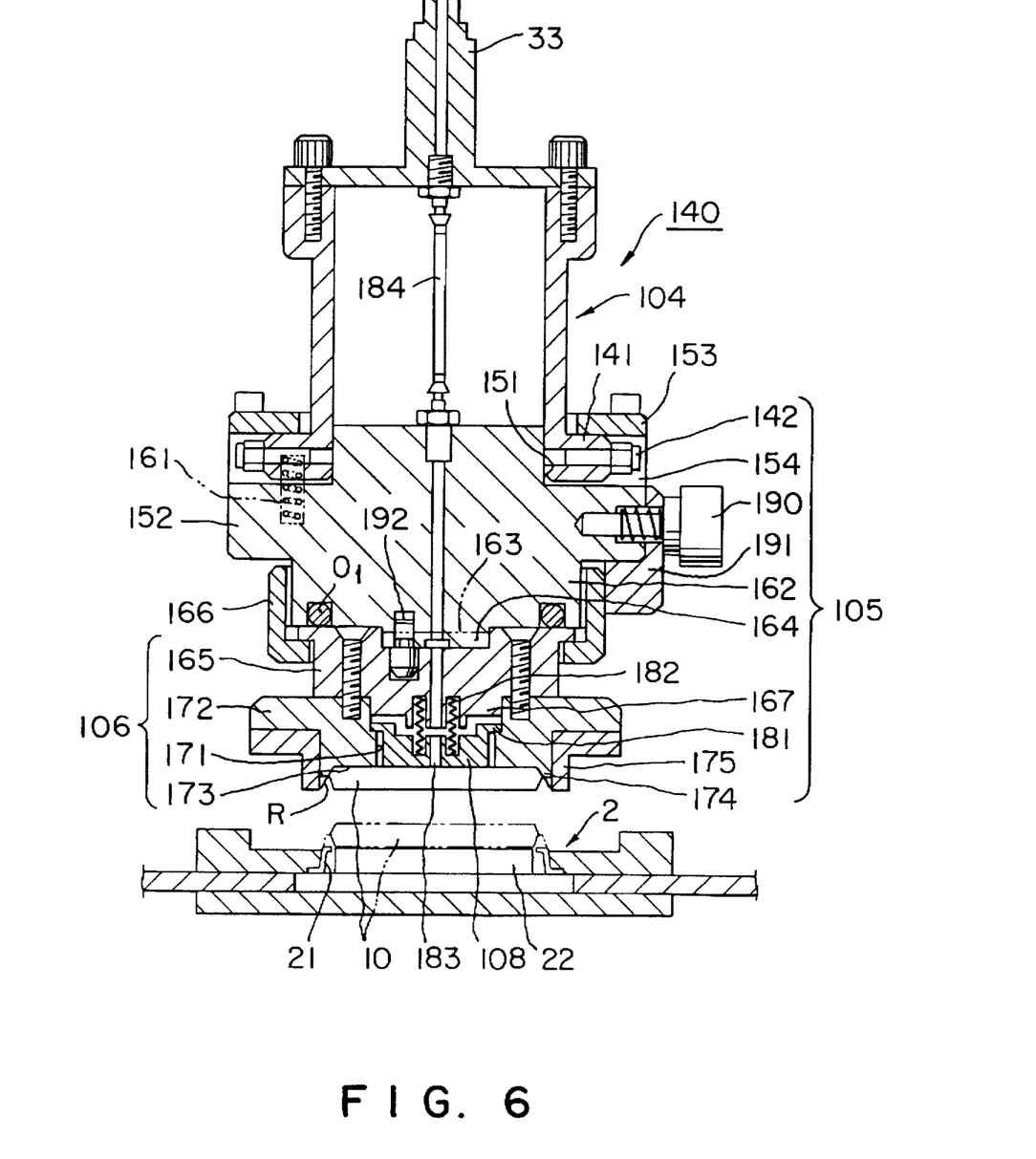
FIG. 6 is a sectional view showing a sucking holder body and a socket unit.
Figure 7:
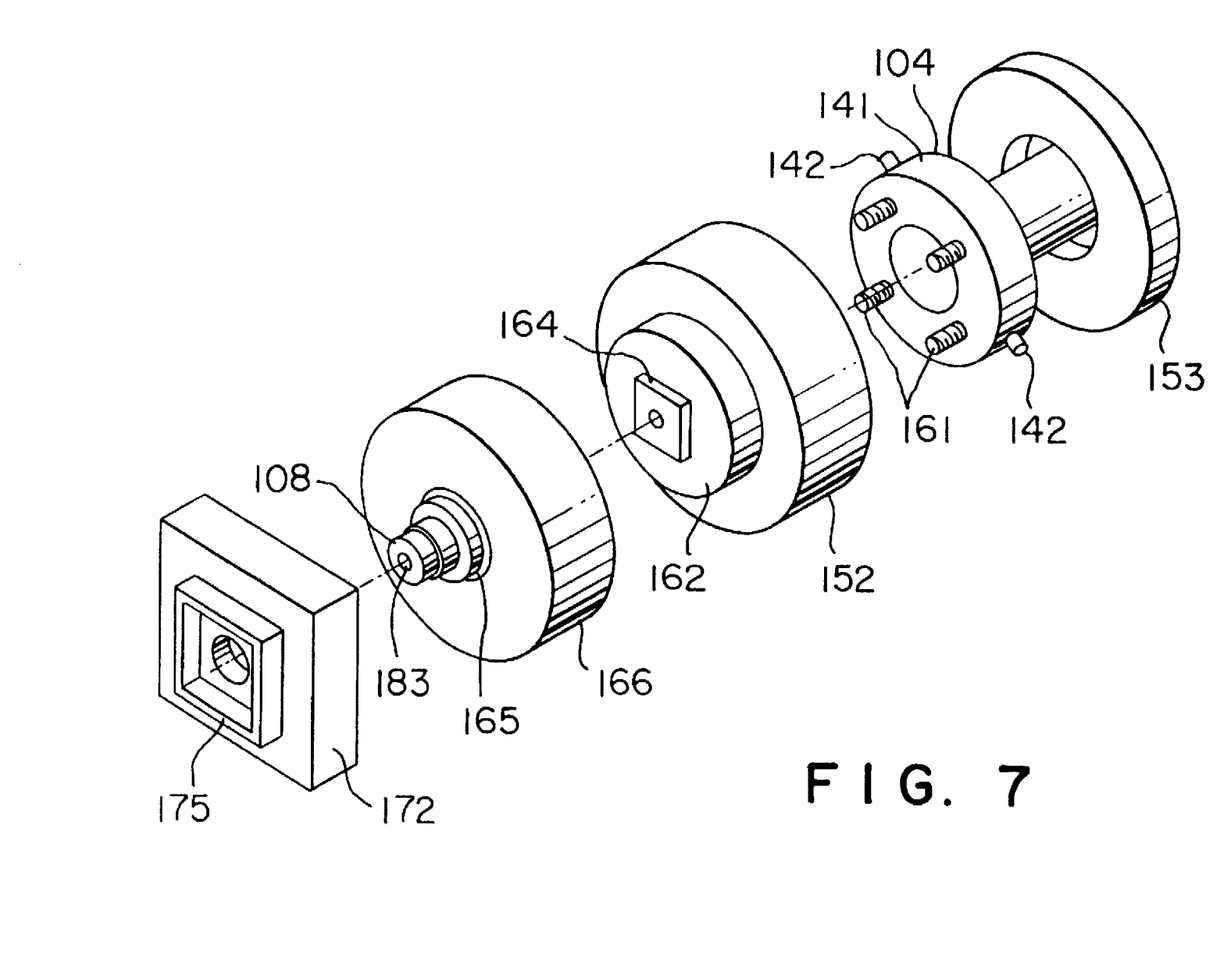
FIG. 7 is an exploded perspective view of the sucking holder body.

As shown in FIG. 5, the transportation apparatus 3 comprises transportation units 3A and 3B which can be moved independently in the X- and Y-directions by means of an X-Y movement mechanism (not shown). The transportation units 3A and 3B can simultaneously hold the devices 10 by suction and move them up and down. FIG. 5 is a perspective view showing an outline of the transportation unit 3A (3B), in which numeral 31 denotes a cylinder mounting plate 31 which is attached to the X-Y movement mechanism. The mounting plate 31 is fixedly fitted with two air cylinders 32 which are penetrated by a piston 33 each. The piston 33 is provided with a cylindrical first section 4 on its lower end. As shown in FIGS. 6 and 7, the first section 104 is formed with a flange 141 on the lower end portion thereof, and constitutes an upper portion of a sucking holder body 140.

The cylinder mounting plate 31 is connected to a fixed plate 31a, which is fixed to a portion 31b of the transportation unit 3A (3B), by means of a tension spring (not shown) which extends and contracts in the vertical direction. When the head of the piston 33 is pressed by push means (not shown), the mounting plate 31 is pressed down against the urging force of the tension spring with respect to the fixed plate 31a.

The first section 104 is connected with a second section 105, which constitutes a lower portion of the sucking holder body 140, in a manner such that it is fitted in the second section 105 with a narrow gap in the axial direction and a direction perpendicular to the axis. The second section 105 includes a receiving portion 152 and a lid portion 153. The receiving portion 152 is formed with a recess 151 which receives the flange 141 therein. The lid portion 153 serves to close an opening edge of the recess 151, thereby preventing the flange 141 from slipping out.

Figure 8:
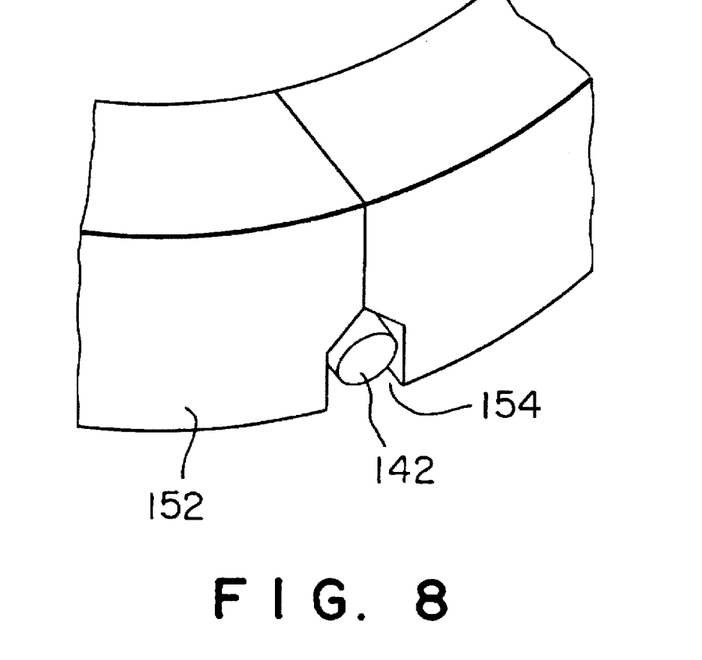
FIG. 8 is a perspective view showing part of the junction between first and second sections of the sucking holder body.

The diameter of the recess 151 is, e.g., 0.15 mm greater than the outside diameter of the flange 141, and its depth is, e.g., 0.2 mm greater than the height of the flange 141. Grooves 154 each having a V-shaped top portion, as shown in FIG. 8, are formed in the side wall portion of the recess 151 in two diametrically opposite positions, while columnar pins 142 having a diameter a little smaller than the depth of the grooves 154 protrude from the peripheral surface of the flange 141 into their corresponding grooves 154. The diameter of each pin 142 is adjusted to a value such that the first section 104 can rotate by, for example, ±1° with respect to the second section 105.

Figure 9A:
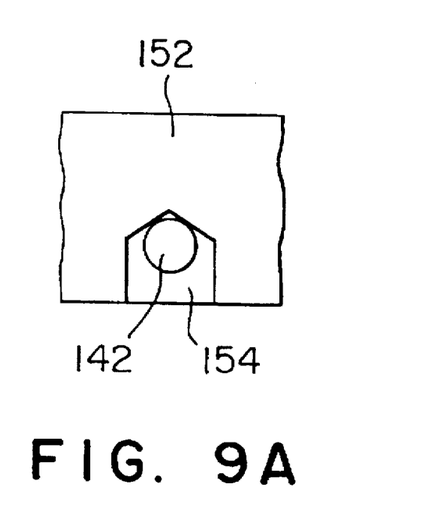
FIG. 9A shows a position such that the first section of the sucking holder body is in a specific position relative to the second section.
Figure 9B:
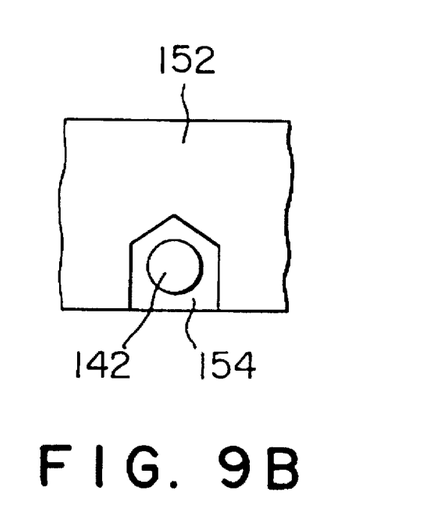
Figure 10:
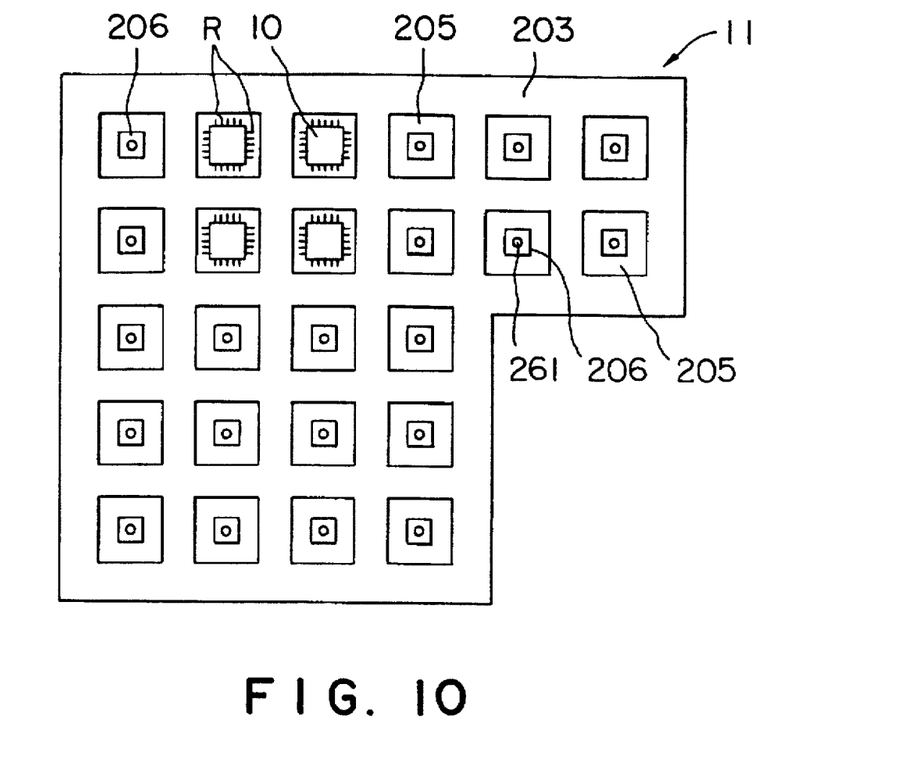
FIG. 10 is a plan view showing a preheating apparatus as the third embodiment of the temperature control apparatus of the invention.

Elastic members, e.g., compression springs 161, are interposed between the receiving portion 152 and the flange 141 in four positions at regular intervals in the circumferential direction of the base of the flange 141. When the first and second sections 104 and 105 are not pressed against each other, the pins 142 are fitted into the top portions of their corresponding grooves 154 by the restoring force of the springs 161, whereby the second section 105 is located in a predetermined position relative to the first section 104, as shown in FIG. 9A. When the two sections 104 and 105 are pressed against each other, on the other hand, the receiving portion 152 is lifted so that the first section 104 can rock relatively to the second section 105 within the range of the aforesaid gap, as shown in FIG. 9B.

A small-diameter portion 162 having a screw portion on the outer peripheral surface thereof is formed on the lower part of the receiving portion 152. The small-diameter portion 162 is formed with a square projection 164 on the lower end thereof. Housed in the small-diameter portion 162 is a heating portion 163 which is formed of, e.g., a resistance heating element.

A lower third section 106 is removably attached to the small-diameter portion 162 of the receiving portion 152 by means of a latch 190 which can be fix the third portion 106 to the portion 162 by one-operation of an operator. That is, the lower third section 106 is composed of an intermediate ring 165, a guide block 172, guide portion 175, etc., which are integrally constructed, as described latter, so that the third section 106 can be exchanged in dependence of the size of the device 10, for example.

In more detail, an upper flange of the intermediate ring 165 is supported on a lower flange of the mounting ring 166 which is fixed to the small-diameter portion 162 of the receiving portion 152 by a nut-stopper 191. The nut-stopper 191 can be removably attached to the receiving portion 152 by the latch 190 of one-operation. Also, the receiving portion 152 is provided with an alignment pin 192 for positioning the intermediate ring 165 at the attachment and removal thereof. Therefore, the third section 106 can be immediately exchanged so as to develop the through-put.

The intermediate ring 165 is fitted on the projection 164. The mounting ring 166 is screwed on the small-diameter portion 162 so that a top flange of the intermediate ring 165 is pressed against the small-diameter portion 162 by a lower projecting edge portion of the mounting ring 166.

The square guide block 172, which has an axial through hole 171 in the center, is fixed to the lower part of the intermediate ring 165. That portion of guide block 172 which surrounds the through hole 171 forms a guide face 173 for guiding the upper surface of each device 10, and a step portion 174 for guiding the upper edge portion of the device 10 is formed on the peripheral edge of the guide face 173. A small-diameter portion 167 of the intermediate ring 165 is fitted in the through hole 171. Under the small-diameter portion 167, a columnar sucker pad 108 formed of metal, such as stainless steel, is fitted in the through hole 171 so as to be movable up and down with a gap of, e.g., 0.3 mm or thereabout between the pad 108 and the small-diameter portion 167.

A flange 181 is formed on the upper end portion of the sucker pad 108. The flange 181 engages a step portion of the inside wall of the through hole 171, thereby regulating a lower limit position for the pad 108. Also, a narrow gap is formed between the outer peripheral surface of the sucker pad 108 and the inside wall of the through hole 171, so that the pad 108 can be inclined at an angle to the axis (longitudinal axis of the sucking holder body 140). When in the lower limit position, the sucker pad 108 projects downward for a short length, e.g., 0.2 mm, from the guide block 172. Compression springs 182, elastic members, are interposed between the sucker pad 108 and the small-diameter portion 167 in four positions at regular intervals in the circumferential direction. In FIG. 6, numerals 01 denote an O-ring.

A ridge portion, which constitutes a guide portion 175 for the reed terminals R of the device 10, is formed on the underside of the guide block 172 so as to surround the step portion 174. The guide portion 175 is adapted to engage the respective distal end portions of the reed terminals R, thus also serving to prevent the terminals R from being dislocated when touched by the socket unit 2. A suction hole 183 is formed so as to extend along the axis of the sucking holder body 140, ranging from the sucker pad 108 to the receiving portion 152. The lower end of the hole 183 opens in the lower surface of the sucker pad 108, while the upper end thereof communicates with a suction pipe 184. The suction pipe 184 is connected to a vacuum pump (not shown) so that the sucker pad 108 can attract the device 10 by vacuum suction.

The following is a description of the operation of the transportation apparatus described above.

As mentioned before with reference to FIG. 1, the transportation unit 3A (3B) is first caused to hold the device 10 in the aligning unit 12 for supply by suction by means of a movement mechanism (not shown) at the top portion of the inspection apparatus. More specifically, the sucking holder body 140 descends to come intimately into contact with the upper surface of the device 10, which is attracted to the sucker pad 108 by vacuum suction or evacuation through the suction hole 183. As this is done, the sucker pad 108 is also sucked in against the urging force of the compression springs 182, so that the upper surface of the device 10 recedes into the position where it is flush with the guide face 173. Thereupon, heat from the heating portion 163 is transferred to the device 10 via the intermediate ring 165 and the guide block 172, whereby the device 10 is heated. Thereafter, the transportation unit 3A (3B) moves to the position over the socket unit 2, and the sucking holder body 140 is lowered by its corresponding air cylinder 32 (see FIG. 5), whereupon the device 10 is placed on a bearer 22 of the socket unit 2, as indicated by chain line in FIG. 6.

Then, the upper end of the piston 33 is pressed by the push means, whereupon the sucking holder body 140 presses the device 10 toward the socket unit 2 through the medium of the sucker pad 108. As a result, the distal ends of the reed terminals R are pressed against the electrodes 21 of the socket unit 2, thus making electrical contact. Thereupon, the device 10 is connected electrically to the test head through the socket unit 2. In this state, that is, with the device 10 kept mounted in the socket unit 2 by the transportation unit 3A (3B), an electrical measurement is conducted to check the device 10 for conformity.

Subsequently, the sucking holder body 140 ascends after it is released from the press, and the transportation unit 3A (3B) moves to the position over the aligning unit 13 for storage. Then, the holder body 140 descends and removes the attraction by vacuum suction, whereupon the device 10 is delivered into the aligning unit 13. Actually, however, the transportation unit 3A (3B) carries two devices 10, so that the two devices are transported in succession to the aligning unit 13 after undergoing inspection in the socket unit 2.

If the device 10 is inclined in one degree or another, according to the embodiment described above, the sucker pad 108 inclines along the upper surface of the device 10 to be intimately in contact therewith, so that the device 10 can be attracted with stability. Since the sucker pad 108 is not deformable itself, moreover, the attitude of the device 10 is stable even when the attraction is removed. Accordingly, a transportation process in the next stage, that is, a process of suction holding by means of the unloader 17, is executed with stability. In mounting the device 10 in the socket unit 2, the upper surface and upper edge portion of the device are guided by the guide face 173 and the step portion 174, respectively, and the reed terminals R are also guided by the ridge portion which constitutes the guide portion 175. Thus, the device 10 is placed on the bearer 22 in a manner such that it is kept in a horizontal attitude and a predetermined direction, so that its reed terminals R are securely in contact with their corresponding electrodes 21.

Since the sucker pad 108 is formed of metal, moreover, the devices 10 cannot be broken by static electricity, and enjoys high durability. Since the devices 10 are heated by the heat transferred from the heating portion 163 via the intermediate ring 165 and the guide block 172, furthermore, stable heating can be effected even though the external shape of the devices 10 is changed.

Further, if the external shape or size of the device 10 is changed, the third section 106 can be immediately exchanged by the latch 190 of one-operation so as to develop the through-put. Also, the heating portion 163 can be used in common for devices of various sizes without being replaced, so that temperature data for the devices 10 need not be obtained with every change of the external shape of the devices once they are obtained at the beginning.

The positions for the reception and release of each device 10 in the aligning unit 12 for supply, socket unit 2, and aligning unit 13 for storage require high accuracy, so that the movement of the transportation unit 3A (3B) must be accurately controlled in the X- and Y-directions. Since the sucking holder body 140 is divided into two parts, the first and second sections 104 and 105, which are connected so as to be slightly rockable and rotatable with respect to each other. If there is a dislocation between the movement mechanism and the access position for the device 10, therefore, the gap between the first and second sections 104 and 105 can absorb the dislocation. Thus, the machining accuracy of X- and Y-guide portions of the movement mechanism and the accuracy of the stop position can be eased.

The push means for pressing the sucking holder body 140 to bring the device 10 securely into contact with the socket unit 2 may be provided independently of the transportation unit 3A (3B) or incorporated in the transportation unit. Alternatively, the device 10 may be pressed by some other push means in a manner such that it is released from the attraction to the sucking holder body 140, thereby allowing the holder body 40 to keep away from the socket unit 2. The objects of inspection are not limited to the devices formed of packaged semiconductor integrated circuits, and may be liquid crystal substrates. Moreover, the transportation apparatus is not limited to the inspection of the objects of inspection, an may be also applied to the transportation of any other objects.

According to the second embodiment of the present invention, objects of transportation or inspection can be stably attracted or released without the possibility of their being broken by static electricity and without being greatly influenced by their attitude. Further, the objects of inspection can be steadily heated without regard to their external shape in the case where the heat from the heating portion is transferred to them via the sucking holder body. Furthermore, the accuracy of movement control of the transportation apparatus can be eased to facilitate manufacture in the case where the sucking holder body is formed of the first and second sections which can rock and rotate relatively to each other.

The following is a description of a case in which a temperature according to a third embodiment of the present invention is applied to an inspection apparatus for devices formed of packaged semiconductor integrated circuit chips. The outline of the inspection apparatus is constructed as same as that of FIG. 1.

Figure 11:
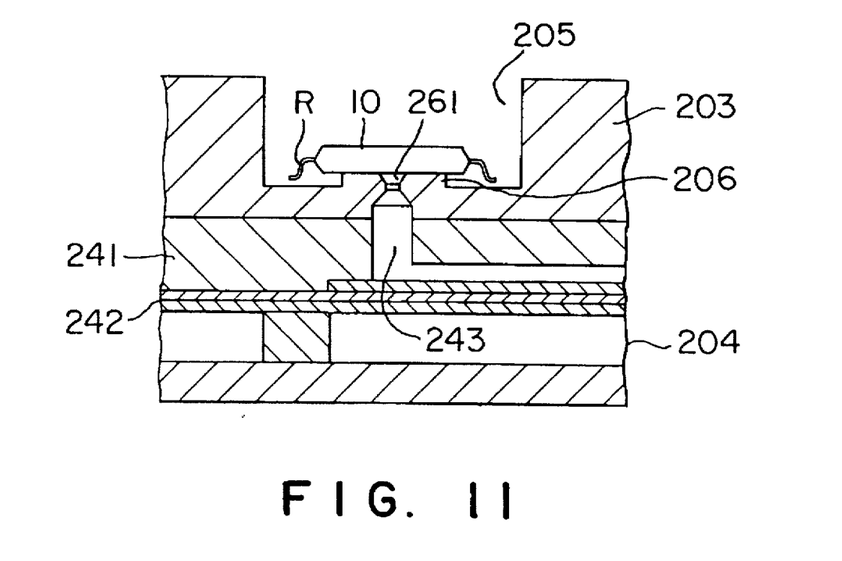
FIG. 11 is a sectional view showing the principal part of the preheating apparatus.
Figure 12:
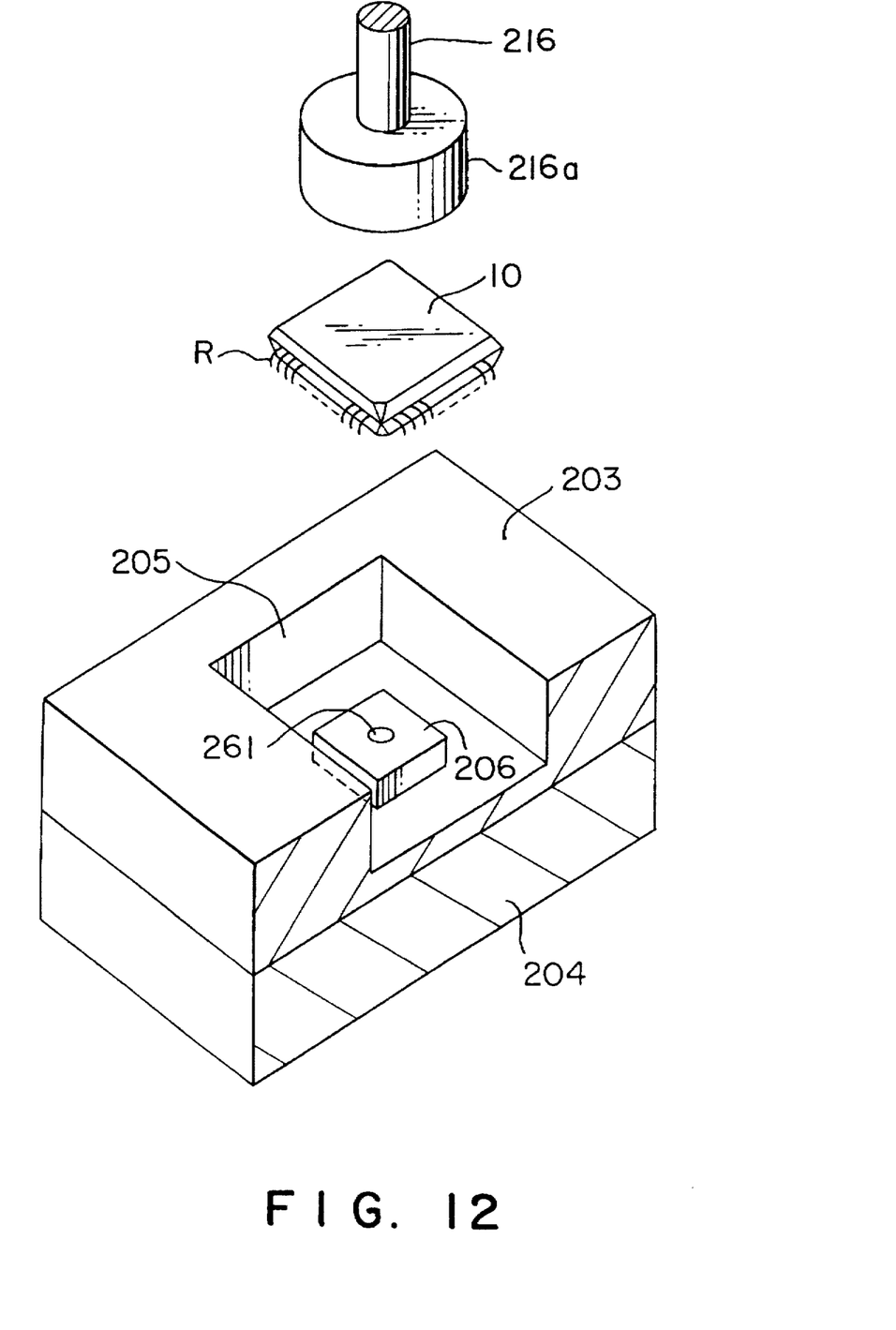
FIG. 12 is a perspective view showing the principal part of the preheating apparatus.

As shown in FIGS. 11 to 12, the preheating apparatus 11 (temperature control apparatus) comprises a carrier plate section 203 of, e.g., aluminum or stainless steel for carrying an object of inspection thereon, and a temperature control unit, e.g., a heating unit 204, removably mounted on the underside of the plate portion 203 by, for example, screwing. A large number of recesses 205 are arranged lengthwise and crosswise in the surface of the carrier plate section 203. Each recess 205 is just large enough to one of the devices 10. Thus, a large number of devices 10 can be heated at the same time.

A device carrier portion 206 is formed in the center of the bottom of each recess 205 so that the bearing surface of each device 10 is higher than the surrounding bottom surface. The level of the bearing surface, compared to the surrounding bottom surface, is adjusted so that the reed terminals R are lifted above the bottom surface when the device 10 is placed on the bearing surface. The devices are somewhat different in size depending on the manufacturer specifications even though they are of the same grade, e.g., 28 mm by 28 mm devices having 208 reed terminals arranged at pitches of 0.5 mm. Thus, devices of the same grade may be different in description. In the case where the carrier plate section 203 is adapted to preheat the devices of the grade concerned, the bearing surface of the carrier portion 206 is adjusted to a size of, e.g., 22 mm by 22 mm which is smaller than that of the devices of the smallest type as the objects of inspection. The recesses 205 are made to measure 38 mm by 38 mm so that the level of the upper surface of each device is, e.g., about 3 mm lower than the surface level of the carrier plate section 203. A suction hole 261 for vacuum suction is bored through the central portion of the carrier portion 206. In the heating unit 204, on the other hand, a heater 242, formed of a resistance heating element, for example, is embedded in a unit body 241 in the form of a thick plate. Also, the heating unit 204 is formed with suction passages 243 which communicate with the respective suction holes 261 of their corresponding carrier portions 206, on the back side of the carrier plate section 203. The suction-side end portion of the passage 243 communicates with a suction pipe which extends from suction means (not shown), for example.

The following is a description of the delivery of the devices 10 to the preheating apparatus 11 and the operation of the apparatus 11.

First, as mentioned before, the loader 16 (see FIG. 1) holds each four devices 10 on each tray T by suction from above and transports them simultaneously. In the preheating apparatus 11, the loader 16 places the devices 10 on the carrier portions 6, while the devices 10 are attracted by vacuum suction through the suction holes 261 from below, and are released from the vacuum suction on the loader side. In this manner, the devices 10 can be steadily delivered from the loader 16 to the preheating apparatus 11 and placed on the carrier portions 206.

The carrier portions 206 are heated by means of the heater 242, and heat from the carrier portions 206 is transferred to the devices 10 so that the devices 10 is preheated to, for example, 150° C. Subsequently, the vacuum suction on the carrier side is removed, and the four devices 10 in the preheating apparatus 11 are simultaneously held and transported to the aligning unit 12 for supply by the loader 16. The devices 10 are oriented in some measure or substantially in both the tray T and the preheating apparatus 11. In order to ensure the contact between the reed terminals R of the devices 10 and the electrodes of the socket unit 2, however, the preheated devices 10 are temporarily transported onto the aligning unit 12 which has aligning recesses in the form of an inverted truncated pyramid each.

According to the preheating apparatus 11 arranged in this manner, the vacuum suction on the loader side is removed after the devices 10 are attracted by the vacuum suction on the carrier side, so that the delivery of the devices 10 is stabilized, and there is no possibility of the devices 10 inclining and slipping down from the carrier portions 206. Since the carrier portions 206, unlike the conventional ones, have no ribs on their peripheral edges, the devices 10 need not be prealigned before they are transported to the preheating apparatus 11, that is, there is no need of an aligning unit, and the number of transportation processes is reduced correspondingly. Even though the devices 10 of the same grade are different in description (or if the devices 10 vary in body size), moreover, each device 10 need not be caused to correspond in size to the bearing surface of each carrier portion 206 in one-for-one relation, and one bearing surface area can be used in common for the devices of various descriptions. Thus, one carrier plate section 203 can be used in common for the devices of each grade. In other words, it is unnecessary to prepare a large number of grade change parts (carrier plate sections) whose ribs vary slightly in size, that is, the number of the grade change parts can be reduced.

Since the carrier plate section 203 is an expensive component, the common use can reduce the cost and the number of operations for the replacement of the carrier plate section 203. Since the devices 10 are attracted to the carrier portions 206 by vacuum suction, moreover, the devices 10 and the carrier portions 206 are highly intimately in contact with one another. Accordingly, the heat from the heating unit 204 can be efficiently transferred to the devices 10, so that electric power for the heating unit 204 can be saved. Since the devices 10 are placed in the recesses, furthermore, they are less influenced by the outside air, and variation of the device heating temperature attributable to the outside air temperature is lessened.

The temperature control apparatus according to the third embodiment of the present invention is not limited to the one which heats objects of inspection, and may alternatively be an apparatus which cools objects of inspection to a predetermined temperature by using a cooling unit in place of the heating unit.

According to the third embodiment of the present invention, the carrier plate section can be used in common for objects of inspection of different descriptions in heating or cooling the objects, and the objects can be heated or cooled efficiently.

What is claimed is:

1. An inspection apparatus for inspecting an object of inspection, having a terminal portion, for electrical properties in a manner such that the object is pressed against a contact portion to bring the terminal portion and the contact portion into contact with each other, comprising:

a transportation unit for transporting the object of inspection to a position opposite to the contact portion;

a sucking holder movable toward and away from the contact portion and adapted to hold the object of inspection by suction;

lifting means for lifting and lowering said sucking holder, thereby contacting the object of inspection against the contact portion; and a pressure contact mechanism provided separately from the transportation unit and adapted to press the sucking holder, thereby pressing the object of inspection against the contact portion.

2. The inspection apparatus according to claim 1, wherein said pressure contact mechanism includes a screw receiving portion, and a screw shaft engaged with the screw receiving portion so as to move longitudinally so that the screw shaft presses the said sucking holder.

3. The inspection apparatus according to claim 2, further comprising a driving source for moving the screw shaft, the driving source including a pulse motor or a servomotor.

4. An inspection apparatus for inspecting an object of inspection, having a terminal portion, for electrical properties in a manner such that the object is pressed against a contact portion to bring the terminal portion and the contact portion into contact with each other, comprising:

a transportation unit for transporting the object of inspection to a position opposite to the contact portion;

a sucking holder movable toward and away from the contact portion and adapted to hold the object of inspection by suction;

lifting means for lifting and lowering said sucking holder, thereby contacting the object of inspection against the contact portion;

a pressure contact mechanism provided separately from the transportation unit with a screw receiving portion, a screw shaft engaged with said screw receiving portion, and a driving source for moving said screw shaft wherein said driving source is a pulse motor or a servomotor, and wherein said screw shaft is adapted to press the sucking holder, thereby pressing the object of inspection against the contact portion.

* * * * *